United States Patent [19]

Auvray

[11] Patent Number: 4,992,967
[45] Date of Patent: Feb. 12, 1991

[54] DIGITAL FILTER USING FOURIER TRANSFORMATION

[75] Inventor: Gérard Auvray, Longpont Sur Orge, France

[73] Assignee: Thomson-CSF, Paris, France

[21] Appl. No.: 258,814

[22] Filed: Oct. 17, 1988

[30] Foreign Application Priority Data

Oct. 16, 1987 [FR] France ............................ 87 14291

[51] Int. Cl.$^5$ .............................................. G06F 15/31
[52] U.S. Cl. .................................................. 364/724.18
[58] Field of Search ...................... 364/724.18, 724.16

[56] References Cited

U.S. PATENT DOCUMENTS

| | | | |
|---|---|---|---|
| 4,093,994 | 6/1978 | Nussbaumer | 364/724.18 |
| 4,100,604 | 7/1978 | Perreault | 364/724.18 |
| 4,530,076 | 7/1985 | Dwyer | 364/724.18 |
| 4,807,173 | 2/1989 | Sommen et al. | 364/724.18 |

FOREIGN PATENT DOCUMENTS 3610195  10/1987  Fed. Rep. of Germany .

OTHER PUBLICATIONS

Schaller Nachrichtentechnische Zeitschrift "Verwendung der Schnellen Fourier Transformation in Digitalen Filtern" vol. 27, No. 11, pp. 425-431 Nov. 1974.
IEEE Transactions on Acoustics, Speech, and Signal Processing, No. 2, pp. 109-114 Apr. 1976, "Digital Filtering by Polyphase Network".
IEEE ASSP Magazine, vol. 3, No. 3, pp. 6-11 Jul. 1986, Bellanger, "New Applications of Digital Signal Processing in Communications".

Primary Examiner—David H. Malzahn
Attorney, Agent, or Firm—Roland Plottec

[57] ABSTRACT

A digital filter having parallel paths with a plurality of transverse filters in the paths. The period of treating the digital information of N connections at the output of a circuit for calculating the discrete Fourier transform on 2N points. The output of the transverse filter is fed to a circuit for calculating the inverse Fourier transform. These two circuits permit the transverse filters to function in each path with a data period of N. The filter will find particular application in convolvers, courolaters, and for circuits for the compression of digital pulses. The filter lends itself to application, particularly in radar, sonar, telecommunications, and in sound and imaging systems.

7 Claims, 7 Drawing Sheets

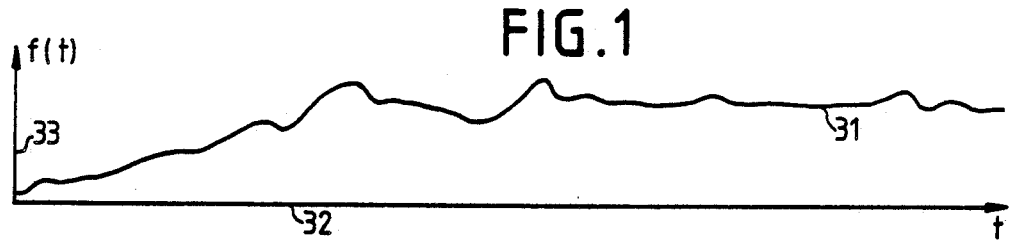
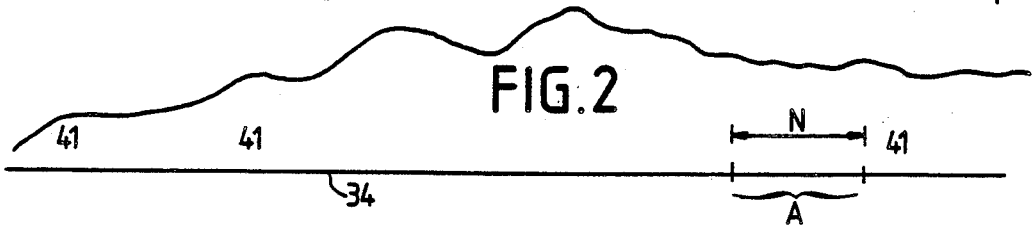
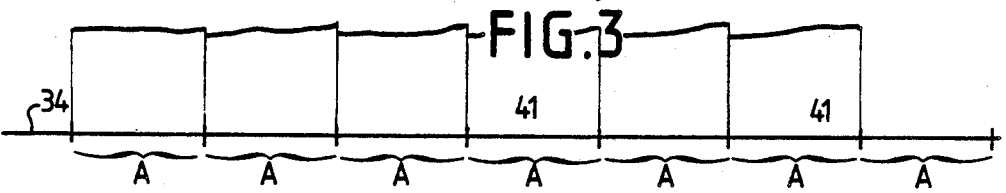
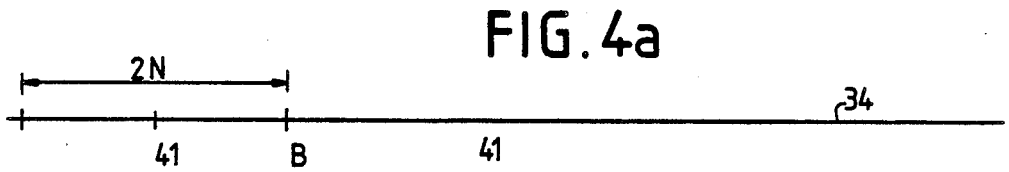
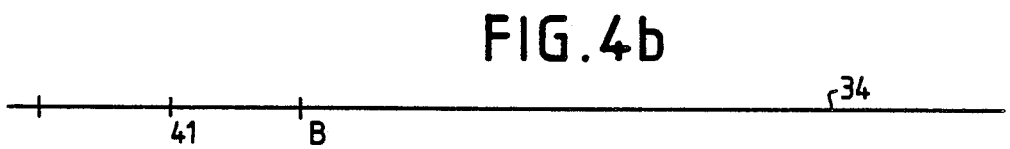
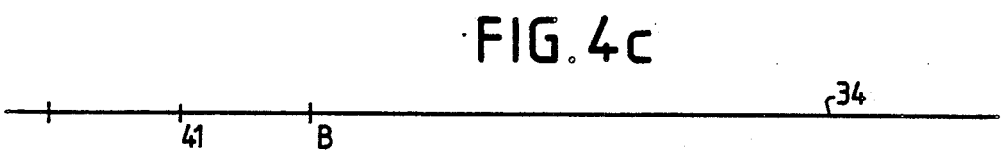
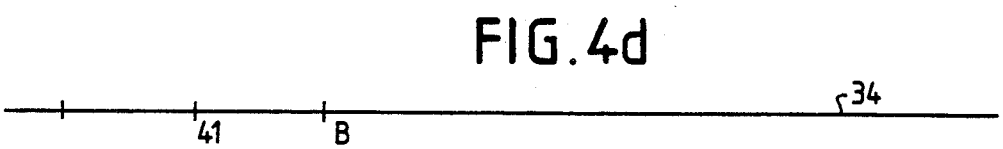

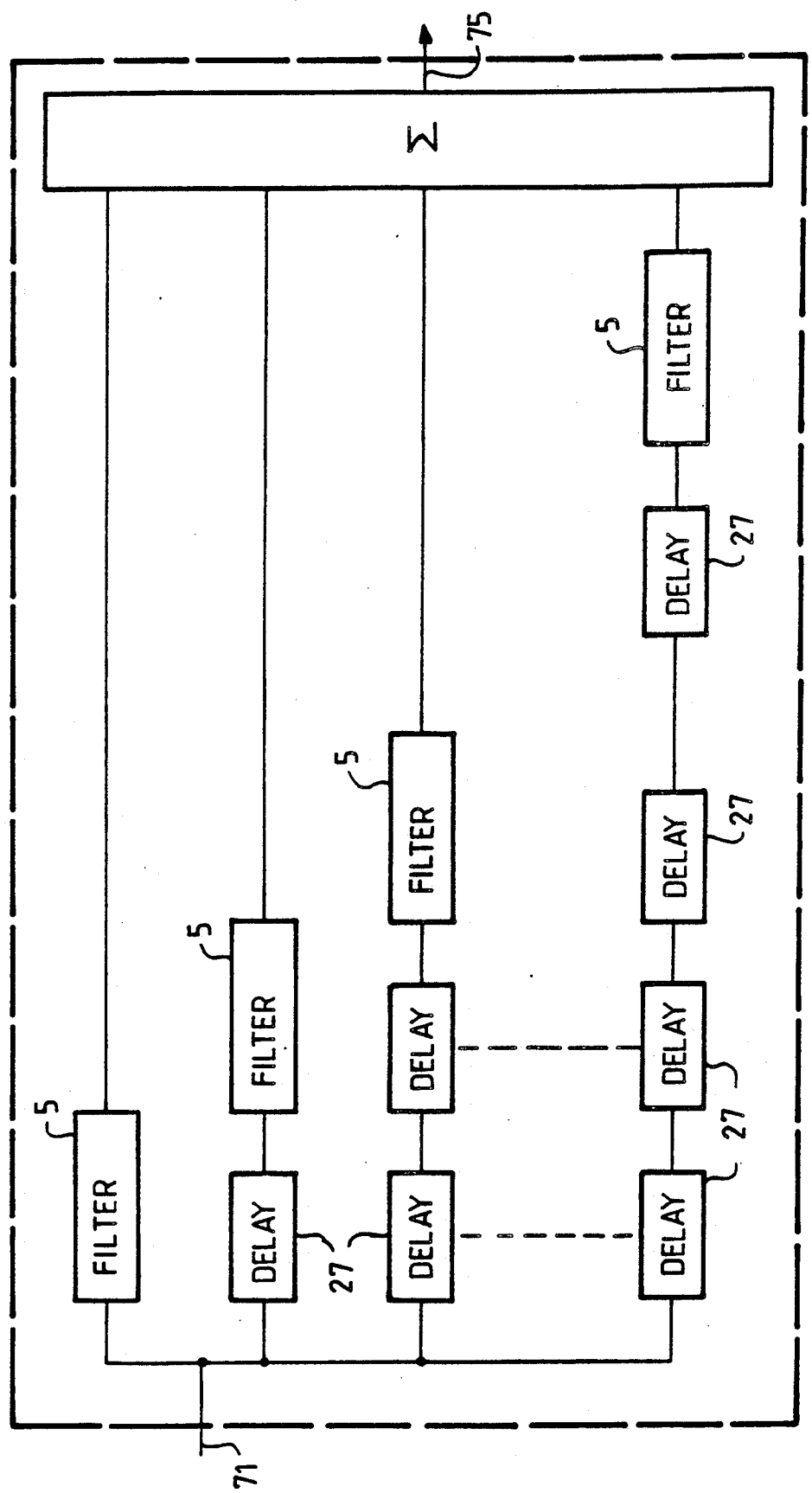
FIG_9

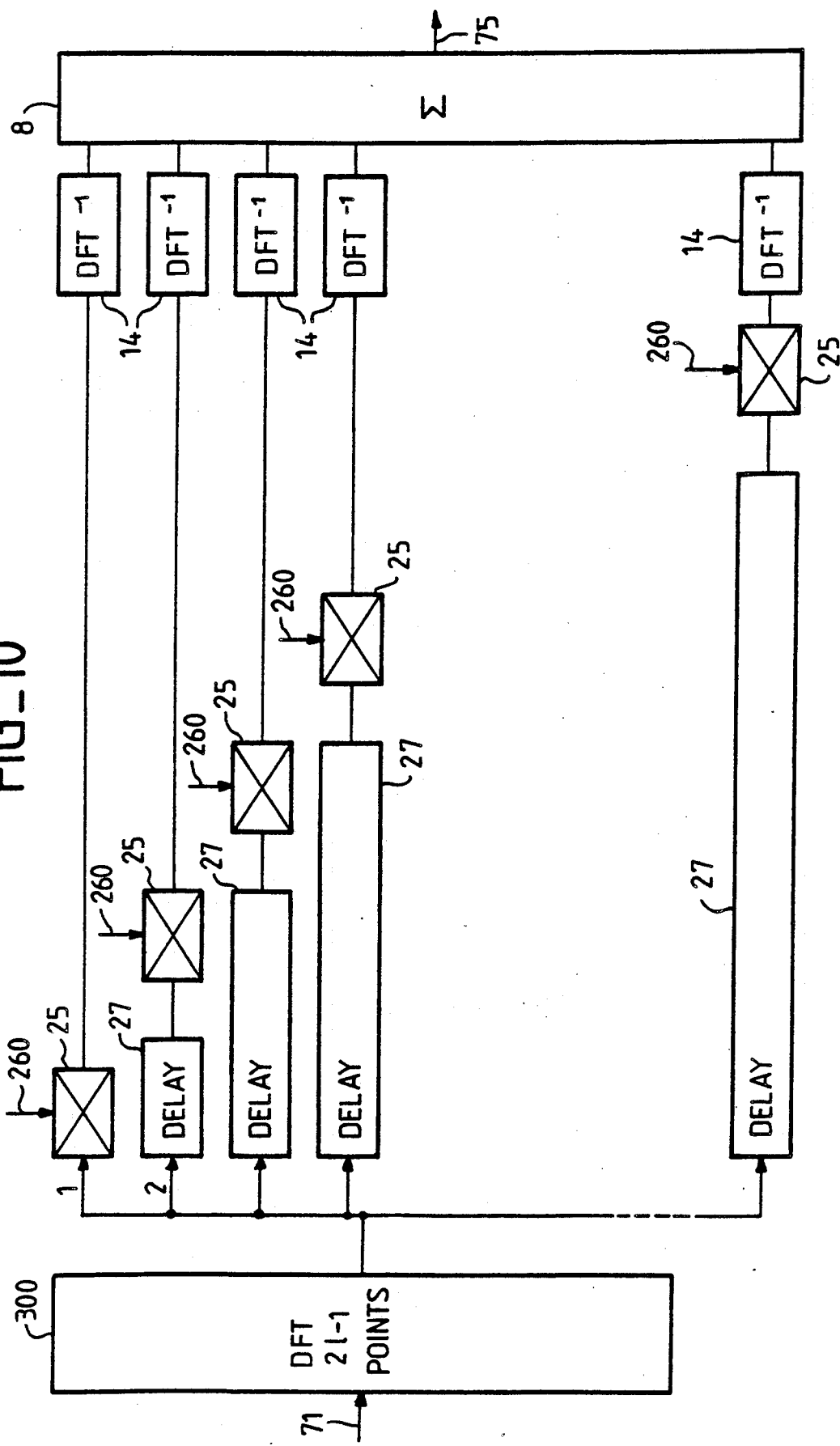

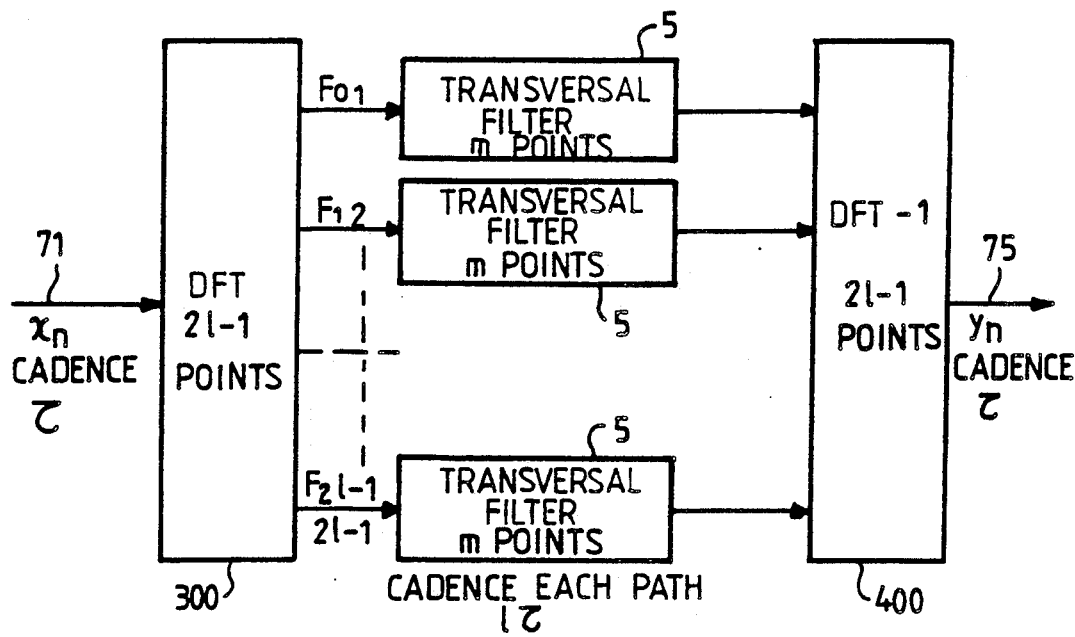
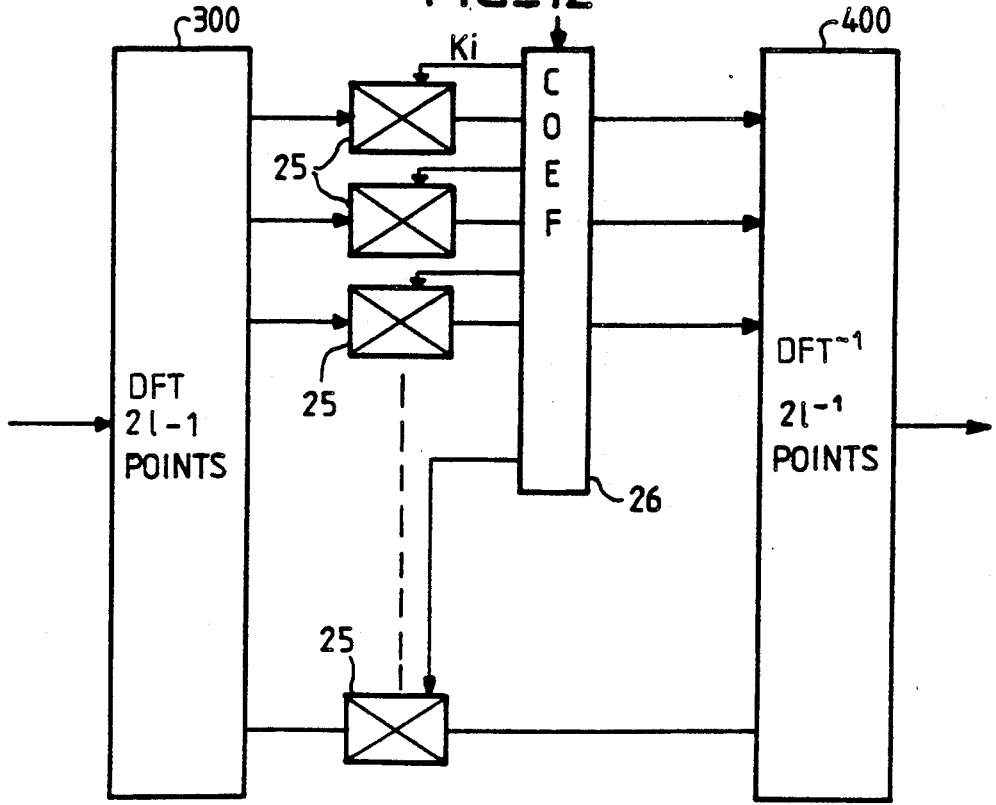

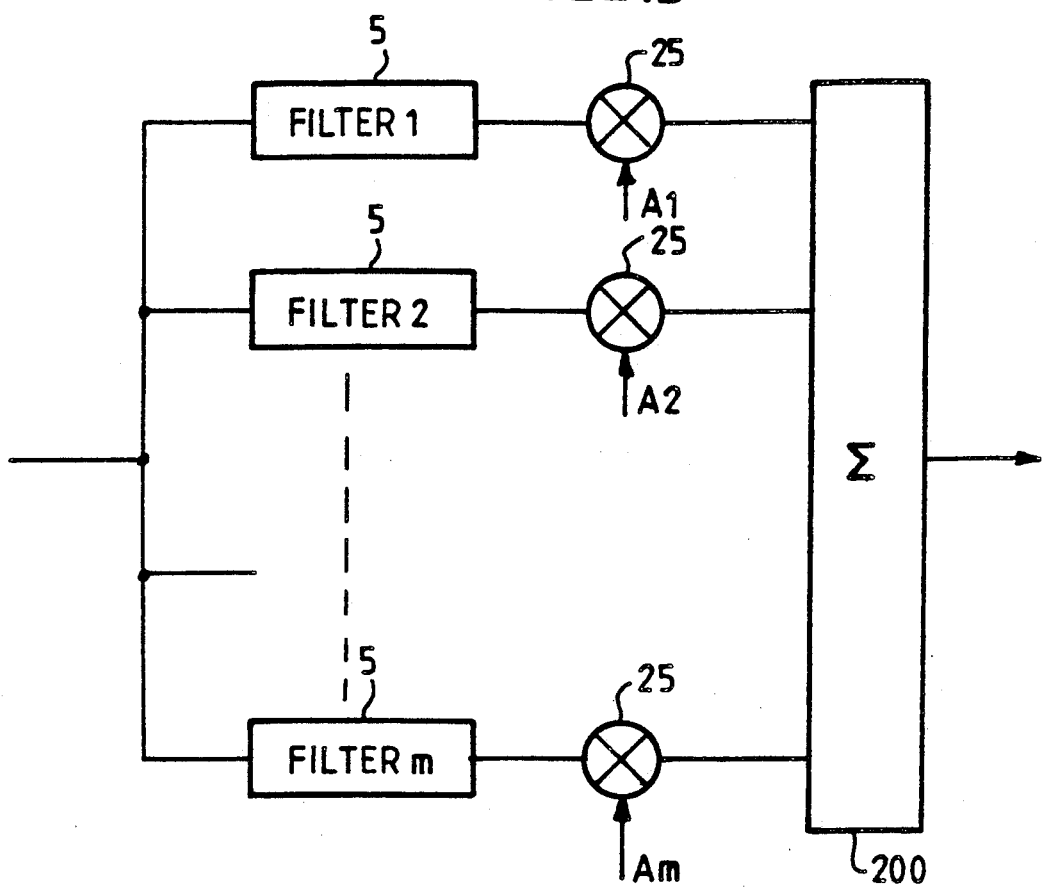

4,992,967

DIGITAL FILTER USING FOURIER TRANSFORMATION

BACKGROUND OF THE INVENTION

The invention relates generally to digital filters, and to radar having digital filters.

The invention also relates to a digital filter having a plurality of paths and the parallel treatment of data in these paths.

It is known in the prior art to filter analog data using a plurality of parallel paths. Particularly, a plurality of parallel treatment paths are used to achieve, in analog form, the compression of radar pulses, when N is the number of paths used. The rate of compression of each path will be equal to $u/N^2$ where u is the rate of compression.

In digital forms, dividing the treatment of the data between N parallel paths with a period of treatment N times slower would be an advantage. The rate of compression affected in each path would be equal to $BT/N^2$, where B is the pass band of the signal, and T the width of a pulse. The rate of compression of the circuit, having N paths in parallel, is equal to $B \times T$.

Previously, it was believed that for N parallel paths sliding was necessary for the digital filtering for each path of the data being filtered in each path and then to sum the results. This leads to a required calculating level proportional to $N^2$. An advantage of the filter of the present invention is a reduction in the needed calculating power brought about by the separation of the paths by a discrete Fourier transform on 2N points. This gives the minimal number of points, specifically $2N-1$, where the convolution of N points with the impulse response on N points of a filter can be correctly calculated by DFT $(DFT)^{-1}$ for the N points of the interval.

An object of the invention is to provide a digital filter having means for calculating the discrete Fourier transform, which is connected in parallel by a plurality of paths along which data is treated. The paths of treatment are connected to means for calculating the inverse discrete Fourier transform. The period of treatment along the parallel paths is N times less than the total input/output period of the device, N being equal to the number of samples treated simultaneously by the filter.

The invention will be better understood by a reference to the following description of different embodiments of the invention and the attached figures.

BRIEF DESCRIPTION OF THE DRAWINGS

FIG. 1 is a curve of a function, which is a function of time.

FIG. 2 is a representation of the curve of FIG. 1 being sampled.

FIG. 3 is a diagram of a part of the samplings of FIG. 2 which are periodic.

FIGS. 4a-4d are diagrams illustrating the calculation of a shifting Fourier transform.

FIG. 9 is a schematic drawing of an embodiment of a circuit of the present invention.

FIG. 10 is a schematic drawing of an embodiment of a circuit according to the present invention.

FIG. 11 is a schematic drawing of an embodiment of a circuit according to the present invention.

FIG. 12 is a schematic drawing of an embodiment of the present invention.

FIG. 13 is a schematic drawing of an embodiment of the circuit of the present invention.

DETAILED DESCRIPTION

Figure 5A:
FIGS. 5a-5d are diagrams showing a first example of operation of a device for calculating the Fourier transform according to the present invention.

In FIG. 1, there is shown a curve 31 of a function f(t), 33 which is a function of time 32. Curve 31 represents, for example, the modulation of an electrical signal. In order to numerically/digitally manipulate this signal, a sampling is made of the signal as shown in FIG. 2.

In FIG. 2, there is shown on a coordinate 34, which corresponds to time 32 of FIG. 1, a value 41 of the function f(t) at time t. If the frequency of sampling the signal tends toward infinity, with the time between two successive samplings approaching zero, then the digitized sampled signal would have all the information contained in the original analog signal. In practice, a sampling frequency is chosen, which conforms to Shannon's Theorem, and it is understood that all increases of the sampling frequency requires the use of superior performing components.

Let us define A an interval of time with N samplings 41. The calculation of the fast Fourier transform of N points in the interval A does not correspond to the calculation of the digitized function of FIG. 2, but to a function rendered periodic as shown in FIG. 3.

In FIG. 3, there is shown a periodic function having a succession of intervals A of N samplings 41. In parallel path filters, for example the one shown in FIG. 8, a shifting Fourier transform is made, as shown in FIGS. 4a-4d, corresponding to a Fourier transform of $N^2$ points.

A cycle of calculation separates FIGS. 4a, 4b, 4c and 4d. In each cycle the Fourier transform of 2N points 41 is calculated by shifting at each cycle the interval of calculation B of a sampling.

In FIGS. 5a-5d there is illustrated a first example of a calculation of the Fourier transform made by the filter of the present invention. One cycle of calculation separates the FIGS. 5a-5d. Only the four first cycles have been shown. It should be understood that the process is continued until the last calculation has been made.

Figure 5B:
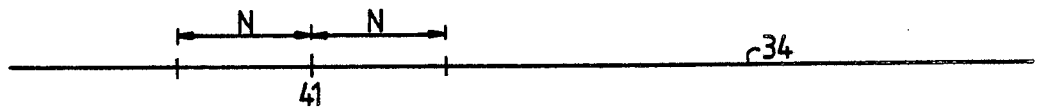
Figure 5C:
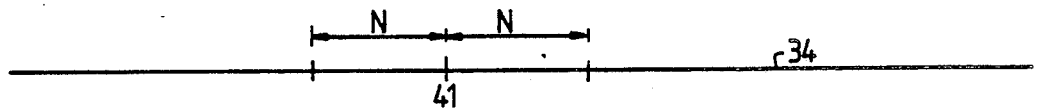
Figure 5D:
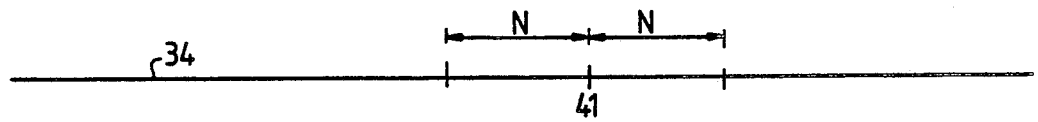

FIG. 5a illustrates the calculations of the fast Fourier transform on 2N points 41. FIG. 5b illustrates the following cycle of calculation, in which a calculation is made on 2N points 41 shifted by N in relation to the points of FIG. 5a. Likewise FIG. 5c, which illustrates a cycle of calculations after that of FIG. 5b, shows the calculation of the fast Fourier transform on 2N points 41 shifted by N in relation to the beginning of the interval of FIG. 5b. During each cycle of calculation, a calculation is made of the fast transform on an interval having 2N points 41, the interval being shifted by N points in relation to the preceding cycle of calculations.

In FIGS. 6a-6d there is illustrated a second example of calculations made in accordance with the filter of present invention. FIGS. 6a-6d are each shifted by one cycle of calculation. At the time corresponding to FIG. 6a a calculation of the fast Fourier transform is made on an interval having N points 41 corresponding to samplings of the signal to be treated followed by N$\phi$.

Figure 6A:
FIGS. 6a-6d are diagrams of a second example of operation of a circuit for calculating the Fourier transform according to the present invention.
Figure 6B:
Figure 6C:
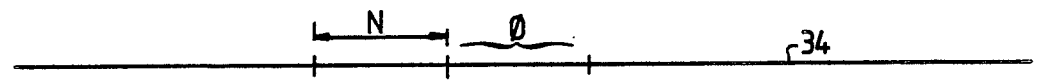
Figure 6D:
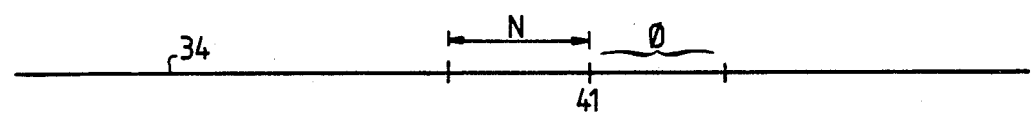

In FIG. 6b calculations are made on the N following points 41 followed by N$\phi$. In each cycle the fast Fourier transform is calculated on an interval having N points followed by N$\phi$. Between two cycles the interval is shifted by N points.

Figure 7:
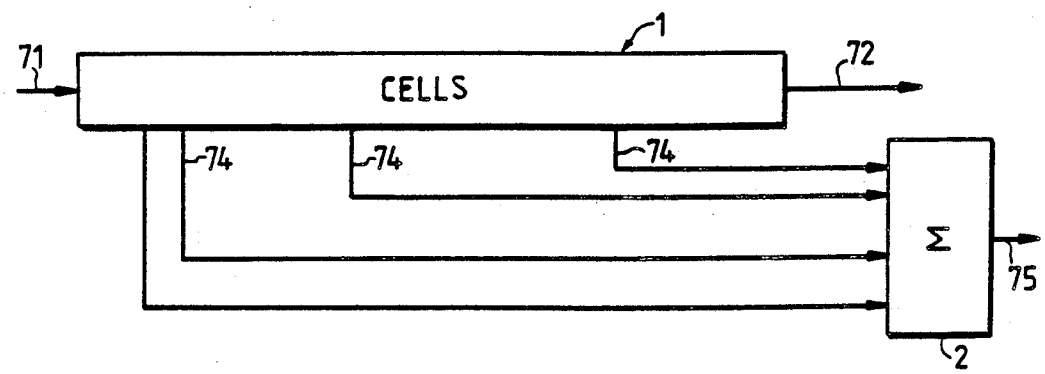
FIG. 7 is a diagram of a transverse filter adopted to be used in the circuit of the present invention.

FIG. 7 shows an example of a filter according to the invention. It has a transversal filter, which is known per se. This filter has several stages which are connected to each other. The signal travels between an input 71 and an output 72 through a plurality of stages 1. The filter has several transversal outputs 74. The outputs 74 are connected to the stages of the filter, and in these filter stages there was a multiplication of the signal by a weighting coefficient. The outputs 74 are connected to an input of a summer 2. The result of these calculations is provided at an output 75 of the summer 2.

The output 72 of the several stages 1 may be connected to an input of a next stage transversal filter (not shown in FIG. 7) and which would be connected in series. The overall transversal filter thus provides a signal summing the two outputs 75.

In the case of the compression of pulses corresponding to the particular values of the multiplication coefficients of the outputs 74, the signal to be used is provided at the output 75.

Figure 8:
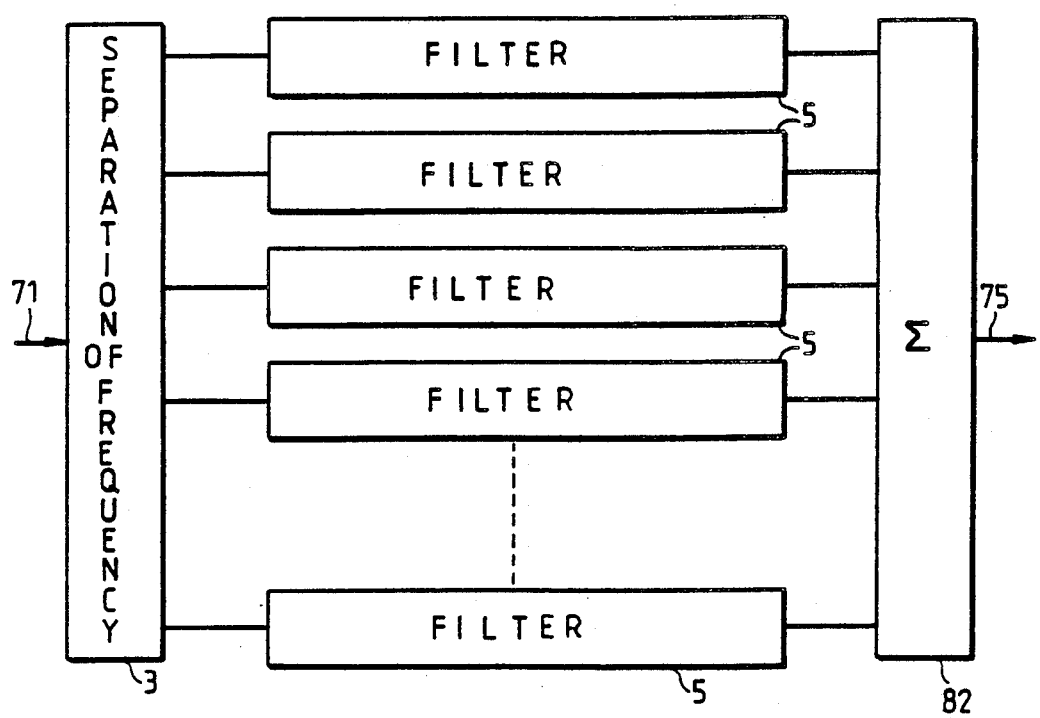
FIG. 8 is a diagram of a digital filter having parallel paths.

In FIG. 8 there is shown a filter of a known type, which is the same as the transversal filter of FIG. 7. The filter of FIG. 8 has a frequency separation filter 3, which may be considered as a digital shifting filter, furnishing output signals on N parallel channels. The filter 3 feeds frequency the sub-bands to filters 5, which are in parallel. The calculation in FIG. 8 is brought about by a shifting calculation, that is to say, in each cycle of calculations, a new sample is fed into the filters 5. This results in the overall calculation of the circuit of FIG. 5 as proportional to $N^2$, N being the number of filters 5. The output of the frequency separation filter 3 is connected in parallel to a plurality of filters 5. These filters 5 redivide the band of the signals to be treated. The filters 5 are digital filters of a known type, which may be of any convenient or conventional type. The outputs of filters 5 are connected to a summer 4. At the output of the summer 4, there is provided a filtered signal. The circuit of FIG. 8 requires a numerical filter having a very large calculating capacity.

In FIG. 9 there is shown a schematic equivalent of the transversal filter of FIG. 7. In FIG. 9 there is shown a filter having parallel channels. Each channel has a filter corresponding to a section 5 of cells of a transversal filter, and having between 0 and l−1 elements leading to a delay increment of l$\tau$: where l is the number of channels.

In FIG. 10 there is shown a circuit equivalent to that of FIG. 9 where the response of each filter corresponds to each of the channels calculated by DFT $(DFT)^{-1}$ having 2l−1 points. Each of the channels 1, 2, ... l has 2l−1 paths corresponding to 2l−1 coefficient DFT of the input signal 71.

The circuit of FIG. 10 provides a transversal filtering function of N points. The calculations are brought about in each of the m parallel paths, each path treating 1 point. Thus, N=m·l.

In the following equations, the superscripts represent the number of a path (1 to m), the subscripts represent the number of sample.

Advantageously, the coefficients 260 are:

$$A^1_i, A^m_i \text{ with } i = 1 \text{ to } 2l-1 \qquad \text{Equation-1}$$

the coefficients of the DFT of the pulse response of the transversal filters 1 to m of FIG. 9.

The numerical signal 720, provided at the output of the filter, are:

$$z_{nr} = \sum_{p=1}^{m} y^p_{nr} \qquad \text{Equation-2}$$

r being the number of points in a unit of the TFD $$y^p_{nr} = \sum_{i=0}^{i=2l-2} F_{ir-(p-1)l} A^p_i \exp(j2\pi ni/2l - 1) \qquad \text{Equation-3}$$

where y is the signal presented at the output of the filters 25:

F being the DFT of the function f to be filtered. Thus:

$$z_{nr} = \sum_{i=0}^{i=2l-2} \exp(j2\pi ni/2l - 1) \left[ \sum_{p=1}^{p=m} F_{ir-(p-1)l} A^p_i \right] \qquad \text{Equation-4}$$

It is $(DFT)^{-1}$ of a group of lines DFT $F'_i$ corresponding to the terms between the brackets.

$$F'_i = \sum_{p=1}^{p=m} F_{ir-(p-1)l} A^p_i \qquad \text{Equation-5}$$

$F'$ is the linear convolution of $F_i$ of the successive blocks with the pulse response of a filter having $A^p_i$ with p=1 to m.

This is implemented by the filter of the invention shown in FIG. 11. The filter of FIG. 11 has a DFT 300 for calculating the DFT, for example, on 2l−1 points connected in parallel to a group of paths having transversal filters 5. The outputs of these transversal filters 5 are connected to the inputs of a inverse DFT calculator 400.

The signal at an input 71 to DFT calculator 300 has a period of $\tau$.

The transversal filters function with a period of l$\tau$.

The signal at an output 75 is provided with also having a cadence of $\tau$. It is possible to replace the number of points of the DFT, $(DFT)-1$ here equal to 2l −1 by an amount 2l which is a power of 2 in such a manner to able to use a calculation device for fast Fourier transforms.

The period of calculation of the circuit corresponds to the band pass of the digitized signal which is able to be treated and in B=1/$\tau$ l$\tau$ being the delay increment of the delay line 27, i.e. the difference of delay introduced between two parallel adjacent paths.

The period at which the transversal filters operate is b where b is small in comparison B.

It is necessary that:

$$\frac{1}{l\tau} = b \qquad \text{Equation-6}$$

The necessary calculating level is thus:

$$m(2l-1)b \simeq 2Nb \qquad \text{Equation-7}$$

The calculating level is thus proportional to N in the case of a filter according to the present invention.

In contrast, for filters of the prior art, the necessary level for calculation was equal to N.B.=Nab with $\alpha = B/b \cdot a$ is the coefficient of growth of the band.

In the case of prior art filters the power of calculation required is proportional to $\alpha N$ and not to N. It is thought desirable to exclude the two extreme known cases from the present invention:

The case where $l=1$, i.e., $m=N$ corresponds to a transversal filter of a known type of a single path;

The case where $m=1$, i.e., $l=N$ corresponds to a classical filter by DFT and DFT inverse.

Thus, in the case of the present invention, $l \epsilon ]1, N[ \cap Z$, that is to say, l pertains to the interval $[1, N]$ with 1 and N excluded, this interval being taken within the set of integers Z and N being the number of points treated by the filter according to the present invention.

In FIG. 12 there is shown an example of a filter according to the present invention which does not have transversal filters but multipliers in each path. These perform the function of separating into small bands, the signal at the input and provides a summing of these bands as shown in FIG. 13.

The circuit of FIG. 12 has a DFT 300 for calculating the DFT on at least $2l-1$ points and is connected to a group of parallel paths. Each parallel path has a multiplier 25. The outputs from the multipliers are connected to a calculating circuit of the DFT inverse 400 on at least $2l-1$ points.

The multipliers 25 receive the coefficients $K_i, i=1$ to m, for example from an output of a memory 26. The memory 26 in the first example of one embodiment of the invention receives the coefficient in series and sends them out in parallel to the multipliers 25.

In an alternative embodiment, the coefficients are stored in memories and are addressed by a sequencer not shown to furnish the necessary coefficients to the function of the circuit in accordance of the present invention.

Advantageously:

$$K_i = F_{ir} \left[ \sum_{p=1}^{p=l} a_p A_i^p \right] \qquad \text{Equation-8}$$

where:
r is the number of blocks of points of DFT;
F is the DFT of the function to be treated;
$a_p$ are the coefficients of the linear combination.
$A_i^p$ are the coefficients of the Fourier transform of the impulse responses from the filters of the parallel paths of FIG. 13.

The results of the calculation are thus:

$$z_{nr} = \sum_{i=0}^{i=2l-1} \exp(j2\pi ni/N) K_i \qquad \text{Equation-9}$$

The period of calculation to the input and to the output of the circuit of FIG. 12 is equal to $\tau$ while in the interior of the circuit according to the invention the period is equal to $l\tau$.

In order to use the FFT one can take 2l power of 2 in place of $2l-1$.

When FFT is used and the filters dividing the band correspond to the l-point FFT filters, the Fourier transform of the impulse responses of each filter only includes one line corresponding to the central frequency of the filters.

The operation of the linear combination after separation into paths may thus be effected by FFT Linear combination of the lines $(FFT)-1$.

There is thus only one line per filter.

$$A_i^p = 0 \text{ if } i \neq p-1 A^b_{p-1} = a. \qquad \text{Equation-10}$$

Therefore, only that lines of the FFT 21 of signals common with the FFT 1 are used.

In this particular case, the FFT; $(FFT)^{-1}$ are thus of a rank equal to the number of paths.

The circuit according to the present invention lends itself to be used particularly in radar, sonar, telecommunications, and for circuits and systems for treating sound and images.

I claim:

1. A digital filter using Fourier transformation for filtering sampled input data comprising samples at a predetermined rate arranged in successive blocks of l samples, said filter comprising:
   first means for calculating a discrete Fourier transform on sets of $2l-1$ points, each set of $2l-1$ samples being shifted by l samples with respect to the preceding one;
   second means for processing data including l parallel filtering paths arranged in a sequence and connected to said first means, wherein said $2l-1$ points of the discrete Fourier transform are applied to each of said paths and wherein said parallel paths comprise respective delay means whereby said delay means are selected for introducing a constant relative delay between each two successive paths in said sequence, said relative delay being equal to l times a sampling interval of said input data; and
   third means connected to said parallel paths for combining signals processed in said paths, said third means having an output delivering filtered data at said predetermined rate, in response to said input data.

2. A digital filter according to claim 1, wherein each of said paths further comprises a transversal filter and wherein said third means consist in summing means for summing said signals processed in said paths.

3. A digital filter according to claim 1, wherein each of said paths further comprises means for effecting a linear convolution of said $2l-1$ points of the discrete Fourier transform with discrete Fourier transforms of impulse responses of l transversal filter sections and wherein said third means comprise l $DFT^{-1}$ means for calculating an inverse discrete Fourier transform respectively connected to said paths and summing means connected to said l $DFT^{-1}$ means.

4. A digital filter using Fourier transformation for filtering sampled input data comprising samples at a predetermined rate arranged in successive blocks of l samples, said filter comprising:
   first means for calculating a discrete Fourier transform on sets of $2l-1$ points, each set of $2l-1$ samples being shifted by l samples with respect to the preceding one;
   second means for processing data including $2l-1$ parallel filtering paths arranged in a sequence and connected to said first means, wherein said $2l-1$ points of the discrete Fourier transform are applied to said paths respectively; and third means connected to said parallel paths for combining signals processed in said paths, said third means having an output delivering filtered data at said predetermined rate, in response to said input data, said third means comprising a DFT$^{-1}$ means for calculating a 2l−1 points inverse discrete Fourier transform on said signals processed in said paths.

5. A digital filter according to claim 4, wherein each of said paths comprises a m-point transversal filter, where m is a predetermined integer, said transversal filters operating with a period equal to l times a sampling interval of said input data.

6. A digital filter according to claim 4, wherein each of said paths comprises a multiplier having a first input and an output, forming an input and an output of said path, and a second input and wherein said second means further comprise memory means for storing 2l−1 coefficients $K_i$, where $1 < i < 2l−1$, and for providing said coefficient $K_i$ to said second input of the multipliers of said paths respectively, said coefficients $K_i$ being selected according to the equation:

$$K_i = F_{ir}\left[\sum_{p=1}^{p=l} \alpha_p A^p\right]$$

where $F_{ir}$ represents the $i^{th}$ point of the discrete Fourier transform calculated by said first means on the $r^{th}$ block of samples, $A^p{}_i$ represents the $i^{th}$ term of the discrete Fourier transform of impulse response of a l-point transversal filter and $\alpha_p$ are coefficients of a weighted linear combination constituting said filtered data delivered by said output of said third means.

7. A digital filter according to anyone of claims 1 to 6, wherein each of said set comprises a block of samples followed by a block of zeros.

* * * * *